US008531188B2

(12) United States Patent
Zhao

(10) Patent No.: US 8,531,188 B2
(45) Date of Patent: Sep. 10, 2013

(54) DETECTOR OF TRANSFORMER INTERTURN SHORT CIRCUIT USING VOLTAGE DIFFERENTIAL

(75) Inventor: Xiping Zhao, Taizhou (CN)

(73) Assignee: Zhejiang Guangtian Transformer Co., Ltd., Taizhou, Zhejiang Province (CN)

( * ) Notice: Subject to any disclaimer, the term of this patent is extended or adjusted under 35 U.S.C. 154(b) by 263 days.

(21) Appl. No.: 13/124,175

(22) PCT Filed: Dec. 23, 2009

(86) PCT No.: PCT/CN2009/075894
§ 371 (c)(1),
(2), (4) Date: Apr. 14, 2011

(87) PCT Pub. No.: WO2010/097002
PCT Pub. Date: Sep. 2, 2010

(65) Prior Publication Data
US 2011/0267072 A1 Nov. 3, 2011

(30) Foreign Application Priority Data

Feb. 28, 2009 (CN) .......................... 2009 1 0096404

(51) Int. Cl.
*G01R 31/06* (2006.01)
(52) U.S. Cl.
USPC ............................. 324/547; 324/546; 324/500
(58) Field of Classification Search
None
See application file for complete search history.

(56) References Cited

U.S. PATENT DOCUMENTS

| 5,514,978 | A | 5/1996 | Koegl et al. | |
| 6,720,705 | B2* | 4/2004 | Nakatsuka et al. | 310/316.01 |
| 6,734,659 | B1* | 5/2004 | Fortner | 324/117 R |

FOREIGN PATENT DOCUMENTS

| CN | 1441257 A | 9/2003 |
| CN | 2611914 Y | 4/2004 |
| CN | 201133924 Y | 10/2008 |
| CN | 201368903 Y | 12/2009 |
| JP | 56-74663 A | 6/1981 |

* cited by examiner

*Primary Examiner* — Jermele M Hollington
*Assistant Examiner* — Trung Nguyen
(74) *Attorney, Agent, or Firm* — Jacobson Holman PLLC; Jiwen Chen

(57) ABSTRACT

An improved interturn short circuit detection device of transformer via differential voltage comprises a single-phase transformer (TM). The single-phase transformer (TM) comprises a high-voltage coil (K) and a low-voltage coil (N). A voltage transformer (PT) is positioned at the high voltage side of the single-phase transformer (TM). Two branches of a tap (K1) of the high-voltage coil (K) are connected with the input of a first converter (Q'), and a first voltage (U1') is obtained. The secondary side of the voltage transformer (PT) is connected with the input of a second converter (Q), and a second voltage (U1) is obtained, and the first voltage (U1') and the second voltage (U1) are compared, and when the voltage difference is above a predetermined primary threshold value, an interturn short circuit failure of the primary side is determined. A tap (N1) of the low-voltage coil (N) and one terminal of the low-voltage coil (N) are connected with the input of a third converter (M'), and a third voltage (U2') is obtained, and two terminals of the low-voltage (N) are connected with the input of a fourth converter (M), and a fourth voltage (U2) is obtained, and the third voltage (U2') and the fourth voltage (U2) are compared, and when the voltage difference is above a predetermine secondary threshold value, an interturn short circuit failure of the secondary side is determined.

1 Claim, 1 Drawing Sheet

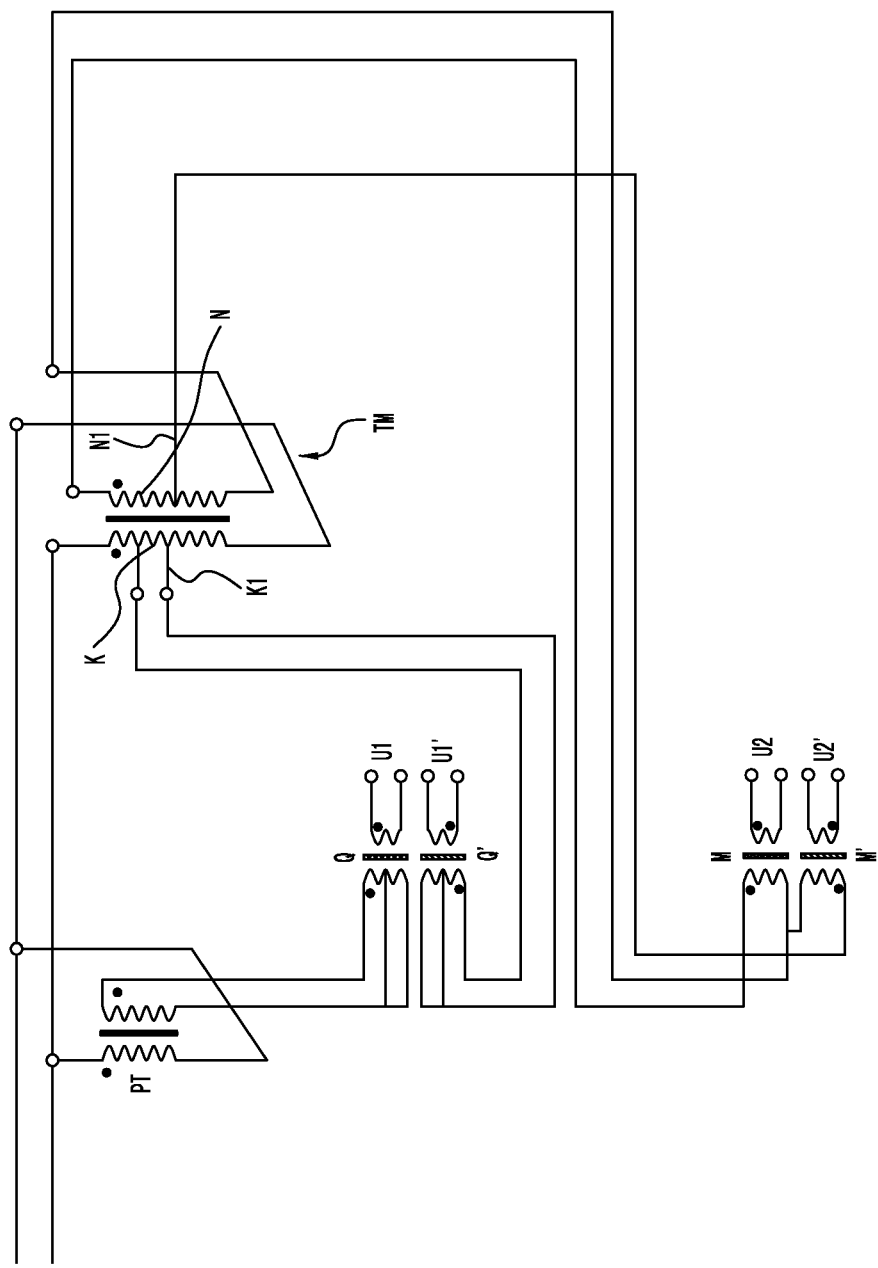

DETECTOR OF TRANSFORMER INTERTURN SHORT CIRCUIT USING VOLTAGE DIFFERENTIAL

This is a U.S. national stage application under 35 U.S.C. 371 of PCT/CN2009/075894, filed on Dec. 23, 2009 and published in Chinese, claiming priority from Chinese Application No. 200910096404.4, filed Feb. 28, 2009, which is hereby incorporated by reference.

FIELD OF THE INVENTION

The present invention relates to an improved detector of transformer interturn short circuit using voltage differential, specially a detector used for detection and protection when transformer interturn short circuit occurs.

DESCRIPTION OF THE PRIOR ART

With the expansion of the urban development, electricity transformers are rapidly increasing in quantity and capacity. However, at present, except for (1) large-capacity transformers, (2) the transformers with special requirements that are installed with current pilot differential detection mechanism to provide interturn and interphase severe short-circuit protection therein, or (3) medium-capacity oil-immersed transformers that are protected by installed Buchholz relays, all other less than 6300 KVA oil-immersed or dry transformers have not been installed with protective circuits for detecting early failure of interturn or interphase short circuit. Generally, these equipment that are not installed with the interturn or interphase short circuit protection in accordance with relevant relay protection design code have the following problems: First, when interturn or interlayer short circuit occurs due to internal or external causes, transformers cannot find the initial small-energy state of failures, which allow the failures to further develop until they develop into severe accidents of a large-capacity short circuit energy state, such as fire, to trigger a protective action at a high voltage input terminal. Thus, the short circuit problems cannot be addressed in an early and timely manner, and the problems expand. Repairing transformers after failure expansion is very difficult, especially when the failure destroys the current overflow protection of the transformer substations at a higher level. This causes severe damages to the safety of power supply and human safety. Second, once an interturn short circuit occurs while the transformer cannot analyze and recognize the type of the failure, it is very difficult to provide proper corresponding protection for the transformer. Hence, the present inventor designed a detector of transformer interturn short circuit using voltage differential and applied for a Chinese patent (No. 200820081814.2). However, the technical scheme of that patent has the following shortcomings: (1) a third coil must be installed in transformer body. However, after the transformer coil is installed, it is hard to install the third coil inside the transformer body so that signal is unable to be extracted and the application range is limited; (2) the signal detected from the third coil may be affected by a higher or lower load and load performances (resistance, capacity and inductance) and thus can hardly satisfy the requirement of differential protection.

(3) the conversion by using the same iron core in the comparison of the sample voltage signal in original patent with the voltage signal of main winding may cause short circuit of the sampling signal and could not achieve signal comparison. In addition, it has a low efficiency and poor precision.

SUMMARY OF THE INVENTION

The object of present invention is to overcome the shortcomings of the existing technique by providing an improved, effective, and high precision detector of transformer interturn short circuit by using voltage differential. The improved detector is feasible in manufacturing technique, unaffected with a higher or lower load and load performances (resistance, capacity and inductance), and satisfies the requirement of differential protection. The sampling voltage signal from the detector is compared with the voltage signal of the main coil converted by an independent converter to avoid affecting test signals.

The technical scheme of the improved detector using voltage differential to detect transformer interturn short circuit of the present invention is as follows. An improved detector of transformer interturn short circuit using voltage differential, comprising a single-phase transformer (TM) in a single-phase high voltage power supply circuit. The single-phase transformer (TM) comprises a high voltage winding (K) and a low voltage winding (N). A potential transformer (PT) is provided on the high voltage side of the single-phase transformer (TM). A high voltage is drawn/taken from the tap (K1) of the high voltage winding (K). The tap (K1) of the high voltage winding (K) is connected to the input end of a first converter (Q') and the voltage at output end of said first converter (Q') is the first voltage (U1'). A second voltage is drawn from the secondary output side of the potential transformer (PT) that is connected to the input end of a second converter (Q). Both output ends of the first converter (Q') and the second converter (Q) are connected to a module to distinguish interturn short circuit at the first output side. The first voltage (U1') and the second voltage (U1) are compared in the said module. When the voltage differential is larger than a preset first threshold value, an interturn short circuit at first output side can be determined.

A low voltage is drawn from a tap (N1) of the low voltage winding (N) connected to the input end of a third converter (M') and the voltage at the output end of said third converter (M') is the third voltage (U2'). Both ends of low voltage winding (N) are connected to the input end of a fourth converter (M) and the voltage at the output end of said fourth converter (M) is the fourth voltage (U2). Both output ends of the third converter (M') and the fourth converter (M) are connected to a module to distinguish interturn short circuit at the secondary output side. The third voltage (U2') and the fourth voltage (U2) are compared in the said module. When the voltage differential is larger than a preset secondary threshold value, an interturn short circuit at secondary output side can be determined.

Further, the tap (K1) of the high voltage winding (K) comprises two additional connectors from the middle winding of the high voltage winding (K) and said two additional connectors are connected to the input end of the first converter (Q').

Still further, the tap (N1) from the low voltage winding (N) is an auxiliary connector from the middle winding of the low voltage winding (N). The auxiliary connector and one end of the low voltage winding (N) are connected to the input end of the third converter (M').

The electro-mechanical detecting process of the improved detector of transformer interturn short circuit using voltage differential of the present invention is as follows. A separate and dedicated potential transformer PT is installed on a high voltage side of a protected transformer (the potential transformer can be regulated at a gear required by the protected transformer). A sample voltage is obtained/drawn from the high, low voltage windings or any other winding with a need to detect short circuit condition. The voltage can be obtained from the taps of a protected winding of a transformer or preset in manufacturing of the transformer. The aforementioned voltage is fed to a voltage converter (the power consumption for the voltage converter shall not affect the detection and comparison precision requirement) that will convert the sample voltage to U1' and the potential transformer will convert voltage U1. Theoretically, the values of U1' and U1 should be identical. Moreover, a partial voltage is drawn from the secondary output side of the transformer, which is converted to voltage U2 on the secondary output side by converting the sampling voltage from the secondary output side, and compared with the converted voltage U2' for correlation comparison. There are two courses of comparison as follows. First, a comparison is made between the secondary output side voltage of the potential transformer with the selected voltage U1'. When a voltage differential is less than a preset value, it cognizes that no short circuit or accident occurs to the primary winding. When the result of the comparison exceeds a preset rating range, a protective signal will be outputted to trigger a protecting system, cognizing that a short circuit or accident occurs to the transformer high voltage winding. Second, a comparison is made between the converted voltage U2 with the voltage U2'. When the voltage differential is less than a specific value, no action signal will be outputted. When a voltage differential exceeds an allowable upper limit, a protective signal will be outputted, cognizing that an accident has occurred to the transformer.

The advantages of the present invention are that it is not affected by a higher or lower load and the load performances (resistance, capacity and inductance). The present invention satisfies the requirement of differential protection. The sampling voltage signal from the detector is compared efficiently and precisely with the voltage signal of the main coil converted by an independent converter to avoid affecting test signals.

BRIEF DESCRIPTION OF THE DRAWINGS

FIG. 1 is a circuit diagram of the improved detector of transformer interturn short circuit using voltage differential.

DETAILED DESCRIPTION OF THE INVENTION

The present invention relates to an improved detector of a transformer interturn short circuit using voltage differential as shown in FIG. 1. The improved detector comprises a single-phase transformer (TM) in a single-phase high voltage power supply circuit. The single-phase transformer (TM) comprises a high voltage winding (K) and a low voltage winding (N). A potential transformer (PT) is installed on a high voltage side of the single-phase transformer (TM). A high voltage is drawn from tap (K1) of the high voltage winding (K). The tap (K1) of the high voltage winding (K) is connected to the input end of a first converter (Q') and the voltage at output end of said first converter (Q') is the first voltage (U1'). A second voltage is drawn from the secondary output side of the potential transformer (PT) that is connected to the input end of a second converter (Q). Both output ends of the first converter (Q') and the second converter (Q) are connected to a module to distinguish interturn short circuit at the first output side. The first voltage (U1') and the second voltage (U1) are compared in said module. When voltage differential is larger than a preset first threshold value, an interturn short circuit at the first output side can be determined.

A low voltage is drawn from a tap (N1) of the low voltage winding (N) connected to the input end of a third converter (M') and the voltage at the output end of said third converter (M') is the third voltage (U2'). Both ends of the low voltage winding (N) are connected to the input end of a fourth converter (M) and the voltage at output end of said fourth converter (M) is the fourth voltage (U2). Both output ends of the third converter (M') and the fourth converter (M) are connected to a module to distinguish interturn short circuit at the secondary output side. The third voltage (U2') and the fourth voltage (U2) are compared in the module. When the voltage differential is larger than a preset secondary threshold value, an interturn short circuit at secondary output side can be determined.

The tap (K1) of the high voltage winding (K) comprises two additional connectors from the middle winding of high voltage winding (K) and said two additional connectors are connected to the input end of the first converter (Q').

The tap (N1) from the low voltage winding (N) is an auxiliary connector from the middle winding of the low voltage winding (N). The auxiliary connector and one end of the low voltage winding (N) are connected to the input end of the third converter (M').

The electro-mechanical detecting process of the improved detector of transformer interturn short circuit using voltage differential of the present invention is as follows. A separate and dedicated potential transformer PT is installed on a high voltage side of a protected transformer (the potential transformer can be regulated at a gear required by the protected transformer). A sample voltage is obtained from the high, low voltage windings or any other winding with a need to detect short circuit condition. The voltage can be obtained from the taps of a protected winding or preset in manufacturing of the transformer. The aforementioned voltage is fed to a voltage converter (the power consumption for the voltage converter shall not affect the detection and comparison precision requirement) that will convert the sample voltage to U1' and the potential transformer will convert voltage U1. Theoretically, the value of U1' and U1 should be identical. Moreover, a partial voltage is drawn from the secondary output side of the transformer, which is converted to voltage U2 on the secondary output side by converting the sampling voltage from the secondary output side, and compared with converted voltage U2' for correlation comparison.

There are two courses of comparison as follows: 1. A comparison is conducted between the secondary output side voltage of potential transformer with the selected voltage U1'. When a voltage differential is less than a preset value, it can be recognized that no short circuit or accident occurs to the primary winding. When the result of the comparison exceeds a preset rating range, a protective signal will be outputted to trigger a protecting system, cognizing that a short circuit or accident occurs to transformer high voltage winding. 2. A comparison is made between the converted voltage U2 with voltage U2'. When the voltage differential is less than a specific value, no action signal will be outputted. When a voltage differential exceeds an allowable upper limit, a protective signal will be outputted. It is recognized that an accident has occurred to the transformer. This circuit is able to cognize all conditions of short circuit and output certain accident signals, and particularly cognize the characteristics of several accidents as follows: (1) During a prophase of interturn short circuit of the transformer, the condition of interturn short circuit is intermittent halt of an energized conductor, which features a small amount of energy of short circuit and instant actuation duration. Since the interturn accident occurs intermittently, the variation of turn number affects the transformation ratio. Thereby processing of this signal will cognize the occurrence of prophase fault and avoid fault extension. (2)

The condition of the instant high resistance at an accident is cognized and an accident signal is output. When short circuit of the transformer winding occurs, wire and conductor will be burned out at a certain period of time. However, the burnout is not at a stable state and, due to the role of high voltage and electromagnetic force, the burnout parts will be fused again by arc welding at the places with broken insulation. Then the fused line will be broken out again by current shocks upon fusing. Such alternation occurs quickly. In this phase, because short circuit does not occur in multiple windings, the accident only produces a small amount of energy. However, the variation of transformation ratio will cause adequate changes at winding breaking and extraction of the signal of voltage differential circuit accident. (3) When some windings of transformer are disabled, broken or short-circuited, the change of winding number will influence transformation ratio and therefore cause the voltage differential to output the signal of short circuit. After comparing the signals converted by a partial voltage and comparable signal converted from the all voltage, the signal characteristic can be used to cognize the state of accident and the order of accident severity. Since the accident state is drawn from either high or low voltage side of every phase, we can not only cognize whether the accident occurred from high voltage or low voltage, but also determine the phase of accident, thus providing data for troubleshoots.

The invention claimed is:

1. An improved detector of transformer interturn short circuit using voltage differential, comprising a single-phase transformer in a single-phase high voltage power supply circuit, the single-phase transformer comprising a high voltage winding and a low voltage winding, a potential transformer being provided on a high voltage side of the single-phase transformer, a high voltage being drawn from a tap of the high voltage winding connected to a first converter and converted to a first voltage by the first converter, a second voltage being drawn from the potential transformer connected to a second converter and converted to a second voltage by the second converter;

wherein a first comparison is conducted between the first voltage and the second voltage and a first result is outputted, then a low voltage is drawn from a tap of the low voltage winding connected to a third converter and converted to a third voltage by the third converter, a second comparison is conducted between the third voltage and the fourth voltage converted by the fourth converter from full voltage of the low voltage winding and a second result is outputted; and wherein the first result and the second result are compared with predetermined values to determine whether short circuit occurs.

* * * * *